(12) United States Patent
Lai et al.

(10) Patent No.: US 7,781,825 B2
(45) Date of Patent: Aug. 24, 2010

(54) SEMICONDUCTOR DEVICE AND METHOD FOR MANUFACTURING THE SAME

(75) Inventors: Erh-Kun Lai, Taichung (TW); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 12 days.

(21) Appl. No.: 11/962,150

(22) Filed: Dec. 21, 2007

(65) Prior Publication Data

US 2009/0101967 A1 Apr. 23, 2009

Related U.S. Application Data

(60) Provisional application No. 60/980,798, filed on Oct. 18, 2007.

(51) Int. Cl.
*H01L 27/088* (2006.01)
*H01L 29/792* (2006.01)

(52) U.S. Cl. ............ 257/326; 257/331; 257/365; 257/401; 257/E29.309; 257/E21.411

(58) Field of Classification Search .......... 257/326, 257/E29.309, E29.411, 314–317, 331–332, 257/401, E29.137, E21.442, E29.3, E29.129, 257/365; 438/151, 257–258, 593–594
See application file for complete search history.

(56) References Cited

U.S. PATENT DOCUMENTS

| | | | |
|---|---|---|---|
| 6,838,322 B2 * | 1/2005 | Pham et al. | 438/151 |
| 7,323,389 B2 * | 1/2008 | Goktepeli et al. | 438/281 |
| 2004/0063286 A1 * | 4/2004 | Kim et al. | 438/283 |
| 2005/0121706 A1 * | 6/2005 | Chen et al. | 438/151 |
| 2005/0227435 A1 * | 10/2005 | Oh et al. | 438/257 |
| 2006/0198190 A1 * | 9/2006 | Lue | 365/185.12 |
| 2007/0063263 A1 * | 3/2007 | Oh et al. | 257/316 |
| 2007/0145431 A1 * | 6/2007 | Kim et al. | 257/288 |
| 2008/0087942 A1 * | 4/2008 | Hsu et al. | 257/324 |
| 2008/0090362 A1 * | 4/2008 | Kim et al. | 438/283 |
| 2008/0237684 A1 * | 10/2008 | Specht et al. | 257/316 |

* cited by examiner

*Primary Examiner*—Zandra Smith
*Assistant Examiner*—Jeremy J Joy
(74) *Attorney, Agent, or Firm*—Thomas, Kayden, Horstemeyer & Risley

(57) ABSTRACT

A semiconductor device includes an insulating layer, a channel structure, an insulating structure and a gate. The channel structure includes a channel bridge for connecting two platforms. The bottom of the channel bridge is separated from the insulating layer by a distance, and the channel bridge has a plurality of separated doping regions. The insulating structure wraps around the channel bridge, and the gate wraps around the insulating structure.

10 Claims, 18 Drawing Sheets

5

5

SEMICONDUCTOR DEVICE AND METHOD FOR MANUFACTURING THE SAME

The application claims the benefit of U.S. Provisional Application No. 60/980,798, filed on Oct. 18, 2007. The subject matter of which is incorporated herein by reference.

BACKGROUND OF THE INVENTION

1. Field of the Invention

The invention relates in general to a semiconductor device and a method for manufacturing the same, and more particularly to a semiconductor device having a gate all around (GAA) structure and a method for manufacturing the same.

2. Description of the Related Art

Various novel semiconductor structures have been proposed with the progress of the semiconductor manufacturing technology, by which the device size is gradually reduced, in order to solve the problem of the physical limitation accompanying therewith. Taking a memory structure as an example, an equivalent width of a channel is increased using a three-dimensional structure. A fin gate memory including a double gate structure or a tri-gate structure is an example of novel memory structure, so that a memory device having a small size still can generate a significant working current.

With the further reduction of the device size, however, the current memory structure still cannot overcome the problem of the caused physical limitation. For example, the control of the gate for switching the channel current encounters a bottleneck. Thus, it is necessary to find a better structure of a semiconductor device so that the semiconductor device having the small size still can possess the good operating property.

SUMMARY OF THE INVENTION

The invention is directed to a semiconductor device and a method for manufacturing the semiconductor device having a gate all around structure, wherein only one single channel structure exists between a source and a drain of the semiconductor device so that the semiconductor device with the small size may possess the good and reliable operation property.

According to a first aspect of the present invention, a semiconductor device is provided. The device includes an insulating layer, a channel structure, an insulating structure and a gate. The channel structure comprises a channel bridge for connecting two platforms. A bottom of the channel bridge is separated from the insulating layer by a distance, and the channel bridge has a plurality of separated doping regions. The insulating structure wraps around the channel bridge, and the gate wraps around the insulating structure.

According to a second aspect of the present invention, a method for manufacturing a semiconductor device is provided. The method includes the following steps. First, a supporting material layer is formed on an insulating layer. Next, a semiconductor material layer is formed on the supporting material layer. Then, the supporting material layer and the semiconductor material layer are patterned, wherein the patterned semiconductor material layer is formed with a channel structure having a channel bridge. Next, a portion of the supporting material layer below the channel bridge is removed to form two supporting pillars. The channel structure is formed on the supporting pillars, and a bottom of the channel bridge is separated from the insulating layer by a distance.

The invention will become apparent from the following detailed description of the preferred but non-limiting embodiments. The following description is made with reference to the accompanying drawings.

DETAILED DESCRIPTION OF THE INVENTION

Figure 1A:
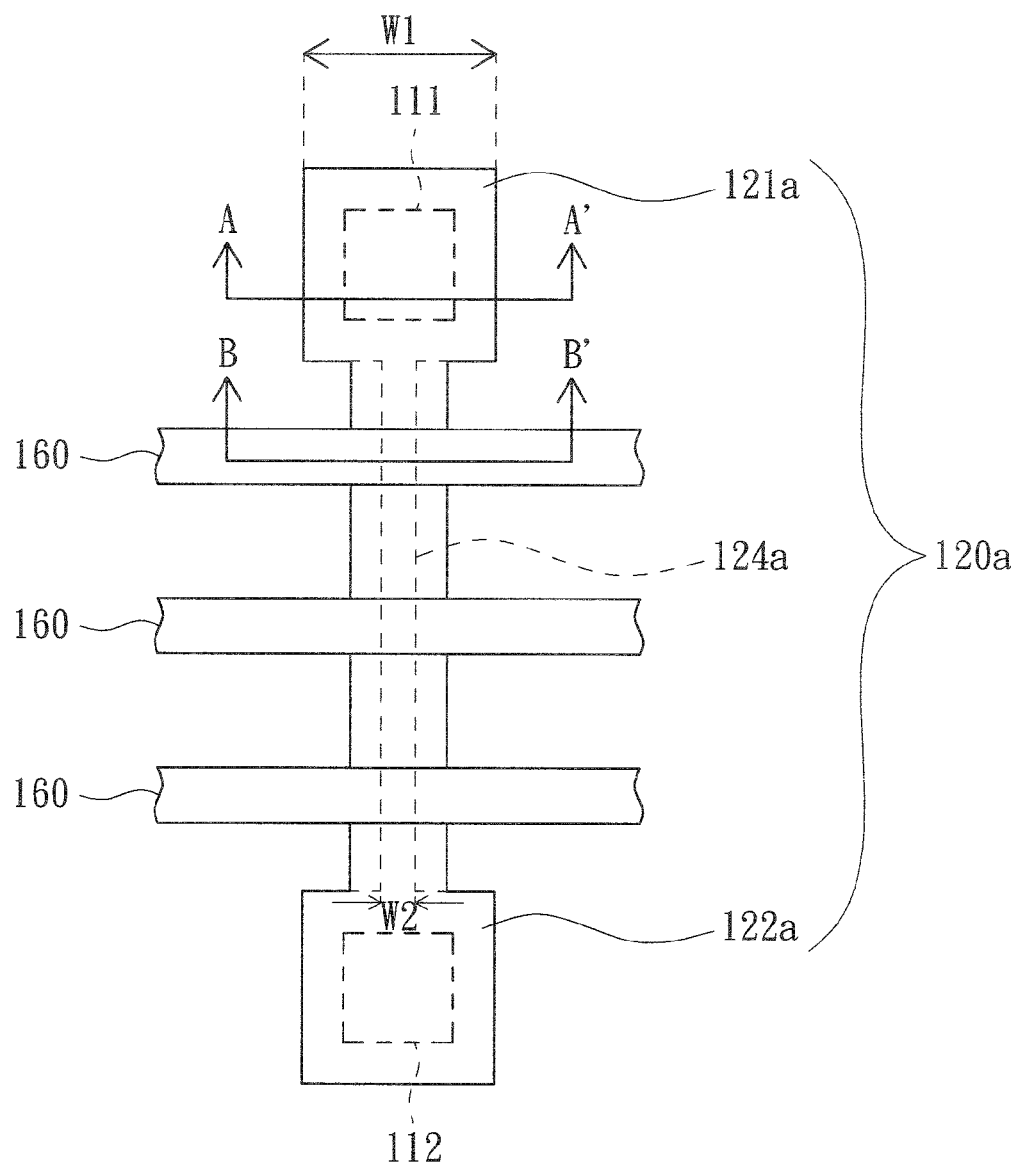
FIG. 1A is a top view showing a semiconductor device according to a preferred embodiment of the invention.
Figure 1B:
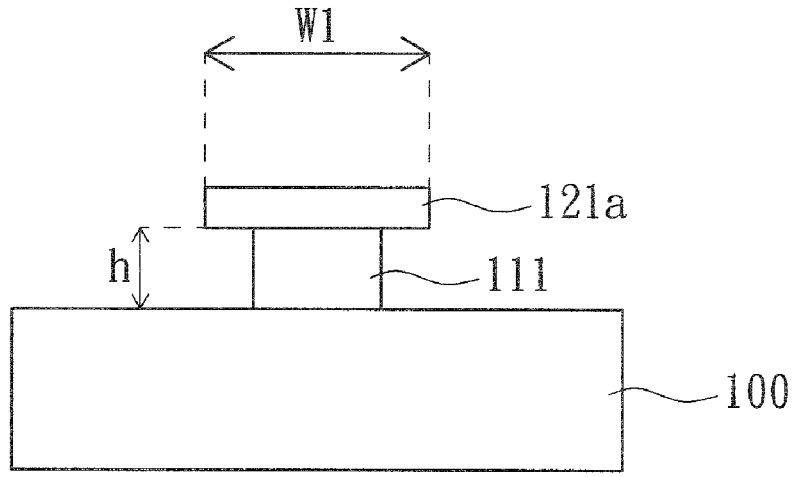
FIG. 1B is a cross-sectional view taken along a line AA' of FIG. 1A.
Figure 1C:
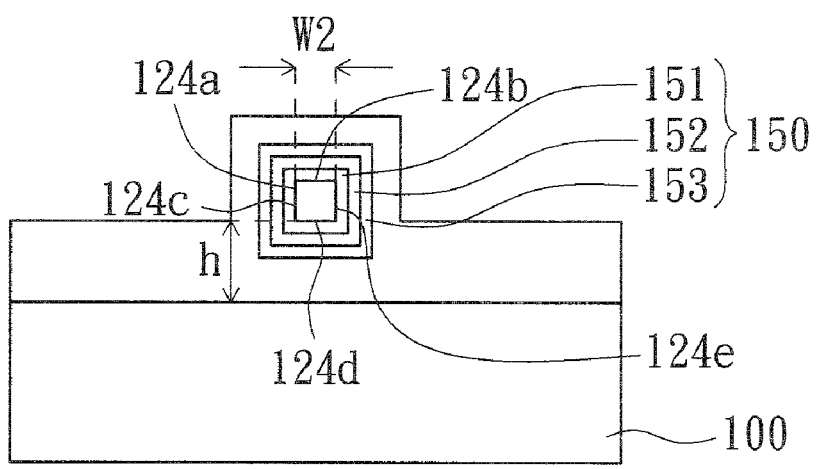
FIG. 1C is a cross-sectional view taken along a line BB' of FIG. 1A.

FIG. 1A is a top view showing a semiconductor device according to a preferred embodiment of the invention, and FIGS. 1B and 1C are cross-sectional views taken along lines AA' and BB' of FIG. 1A. Referring to FIGS. 1A to 1C, the semiconductor device 5 includes an insulating layer 100, two supporting pillars 111 and 112, a channel structure 120a, an insulating structure 150 and gates 160. The two supporting pillars 111 and 112 protrude from the insulating layer 100. The channel structure 120a includes two platforms 121a and 122a and a channel bridge 124a. The two platforms 121a and 122a are respectively disposed on the two supporting pillars 111 and 112 and are separated from the insulating layer 100 by a distance h. The channel bridge 124a connects the platforms 121a and 122a together. A bottom of the channel bridge 124a is separated from the insulating layer 100 by the distance h. The insulating structure 150 wraps around the channel bridge 124a, and the gates 160 wrap around the insulating structure 150.

In this embodiment, the semiconductor device 5 has a NAND memory structure, for example. Therefore, several gates 160 are formed on the channel bridge 124a between the platforms 121a and 122a serving as the source/drain regions. Referring to FIG. 1C, the channel bridge 124a includes a first surface 124b, a second surface 124c, a third surface 124d and a fourth surface 124e. The insulating structure 150 wraps around the first surface 124b to the fourth surface 124e, and the gates 160 are also disposed above the first surface 124b to the fourth surface 124e. Therefore, when the gates 160 turn on, channels will be formed on the first surface 124b to the fourth surface 124e of the channel bridge 124a. Consequently, the total equivalent width of the channel is substantially increased, and the moving range of the charge carrier can be thus increased greatly so that the operation efficiency of the semiconductor device is increased. In addition, the gates 160 completely wrap around the channel bridge 124a. So, when the size of the semiconductor device 5 is very small, the gate 160 still has the excellent control ability for switching the channel.

As shown in FIGS. 1A and 1C, a width W2 of the channel bridge is smaller than a width W1 of each of the two platforms 121a and 122a. The material of each of the channel bridge 124a and the platforms 121a and 122a is polysilicon, and the material of each of the supporting pillars 111 and 112 is silicon nitride.

As shown in FIG. 1C, the insulating structure 150 includes a blocking layer 151, a charge storage layer 152 and a tunneling dielectric layer 153 in the semiconductor device 5 of this embodiment. The blocking layer 151 and the tunneling dielectric layer 153 are respectively disposed adjacent to the charge storage layer 152. In this embodiment, for example, the material of the blocking layer 151 is silicon oxide, the material of the charge storage layer 152 is silicon nitride, and the material of the tunneling dielectric layer 153 is silicon oxide. Because the tunneling dielectric layer 153 is disposed between the gate 160 and the charge storage layer 152, a memory having a "Top SONOS" structure is formed. The charge carrier may be injected into the charge storage layer 152 via the gate 160. If the tunneling dielectric layer 153 is omitted, the gate 160 is directly disposed on the charge storage layer 152 and the memory with the SNOS structure is formed.

In addition, if the tunneling dielectric layer 153 is replaced with an oxide-nitride-oxide (ONO) layer, a memory having a "Top BE-SONOS structure" is formed. The thickness of the oxide layer adjacent to a charge carrier injecting end in the ONO layer may be smaller than 20 angstroms (Å), may range from 5 to 20 Å or may be smaller than 15 Å. The thickness of the nitride layer in the ONO layer may be smaller than 20 Å or may range from 10 to 20 Å. The thickness of the oxide layer adjacent to a charge storage structure 142 in the ONO layer may be smaller than 35 Å or may range from 15 to 35 Å. In addition, if the tunneling dielectric layer 153 is replaced with the material of an oxide-silicon-oxide (OSO) layer, a memory having a "Top SOSONOS" structure is formed.

However, the technology of this invention is not limited thereto. As shown in FIG. 1C, the tunneling dielectric layer 153 and the blocking layer 151 may be exchanged with each other. In other words, the tunneling dielectric layer is disposed between the channel bridge 124a and the charge storage layer 152, and the blocking layer is disposed between the gate 160 and the charge storage layer 152, and a memory having a SONOS structure is formed. The charge carrier is injected into the charge storage layer 152 from the channel bridge 124a. Similarly, the tunneling dielectric layer may be replaced with the ONO layer so that a memory having a BE-SONOS structure is formed. If the tunneling dielectric layer is replaced with an OSO layer, a memory with a SONO-SOS structure is formed. In addition, if the material of the gate is tantalum nitride and the material of the blocking layer is replaced with aluminum oxide, a memory having a TANOS structure is formed.

In addition, if the insulating structure 150 is only an oxide layer made of, for example, silicon oxide, the semiconductor device 5 forms a transistor. According to the gate all around (GAA) design, the operation of switching the channel can be effectively controlled, and a reliable control element in a small-size electronic device may be provided.

Figure 2:
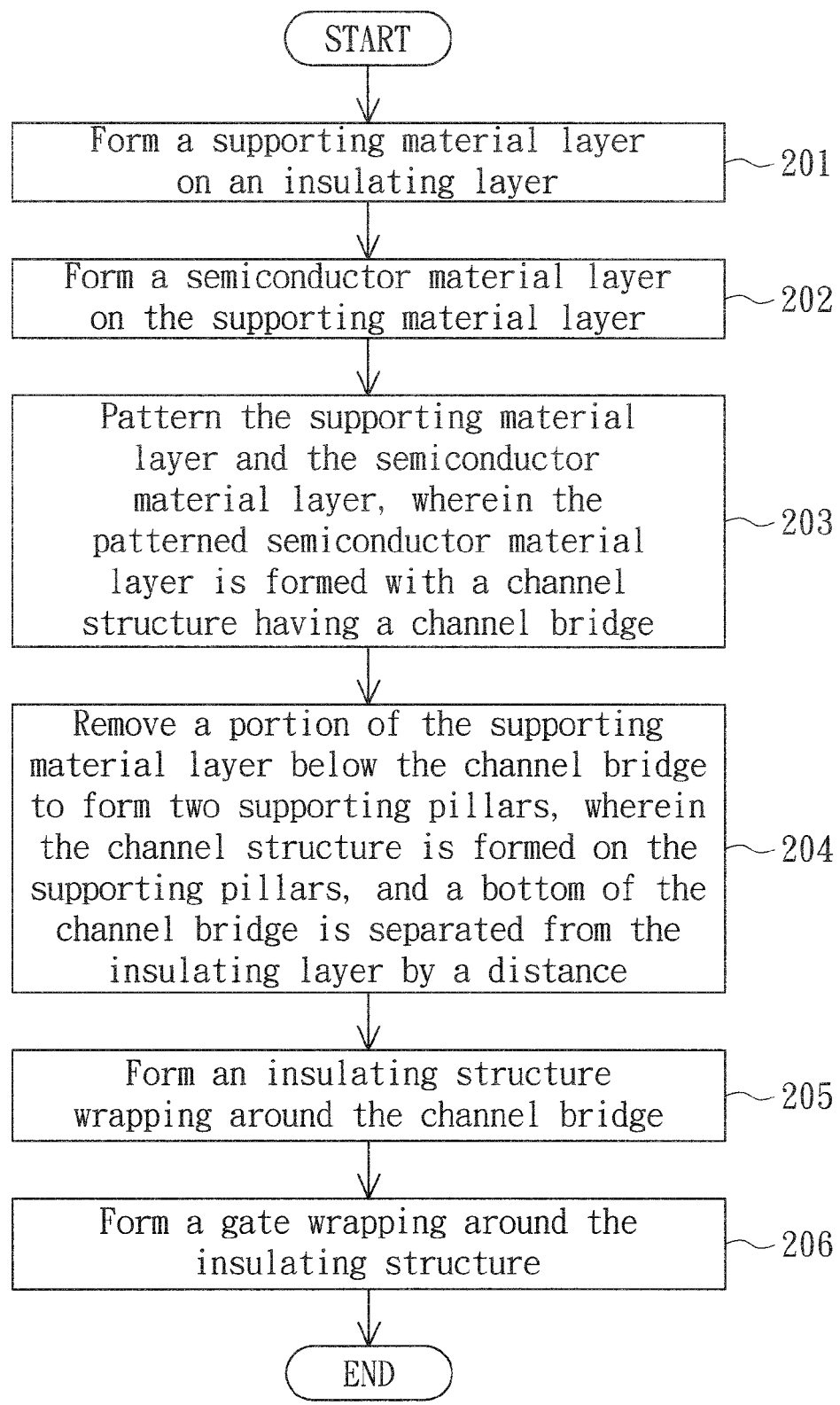
FIG. 2 is a flow chart showing a method of manufacturing the semiconductor device according to the preferred embodiment of the invention.

The method for manufacturing the semiconductor device according to the preferred embodiment of the invention will be described in the following. FIG. 2 is a flow chart showing a method of manufacturing the semiconductor device according to the preferred embodiment of the invention.

Figure 3:
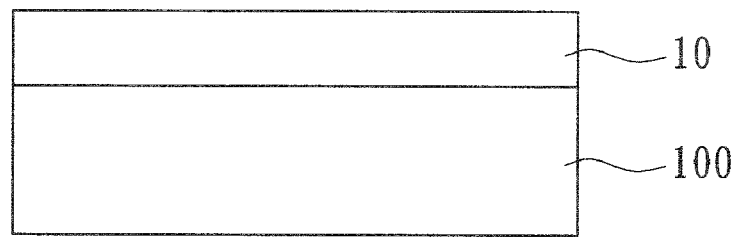
FIG. 3 is a schematic illustration showing a step of forming a supporting material layer.

FIG. 3 is a schematic illustration showing a step of forming a supporting material layer. As shown in FIGS. 2 and 3, a supporting material layer 10 is formed on the insulating layer 100 in step 201. The insulating layer 100 is an inter-layer dielectric (ILD) layer or a field oxide (FOX) layer, and the used materials may include oxide, boro-phospho-silicate glass (BPSG), phospho-silicate glass (PSG), fluorinated silicate glass (FSG) or other low dielectric materials. Preferably, the supporting material layer 10 is made of silicon nitride, and has a thickness ranging from 200 to 1000 Å.

Figure 4:
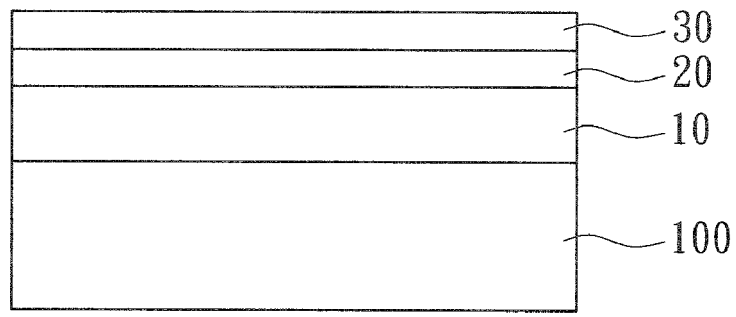
FIG. 4 is a schematic illustration showing a step of forming a semiconductor material layer.

FIG. 4 is a schematic illustration showing a step of forming a semiconductor material layer. As shown in FIGS. 2 and 4, the semiconductor material layer 20 is formed on the supporting material layer 10 in step 202. Preferably, the material of the semiconductor material layer 20 is polysilicon, and the thickness of the semiconductor material layer 20 ranges from 200 to 800 Å.

Figure 5:
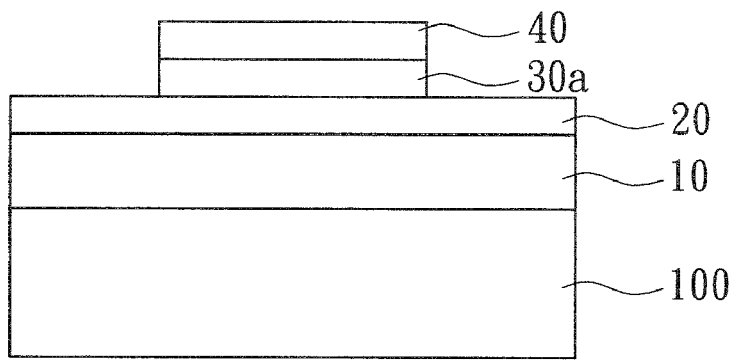
FIG. 5 is a schematic illustration showing a step of forming a patterned hard mask material layer.

Preferably, the method further includes the step of forming a hard mask material layer 30 on the semiconductor material layer 20 after the step 202 and before a photoresist material layer is formed, as shown in FIG. 4. Next, the photoresist material layer (not shown) is formed on the hard mask material layer, and a patterned photoresist layer 40 is formed after a photo-lithography manufacturing process. Then, the hard mask material layer is etched according to the patterned photoresist layer 40 so that a patterned hard mask layer 30a is formed between the semiconductor material layer 20 and the patterned photoresist layer 40. FIG. 5 is a schematic illustration showing a step of forming the patterned hard mask material layer. Preferably, the thickness of the patterned hard mask layer 30a ranges from 200 to 1500 Å. Next, the patterned photoresist layer 40 is removed.

Figure 6A:
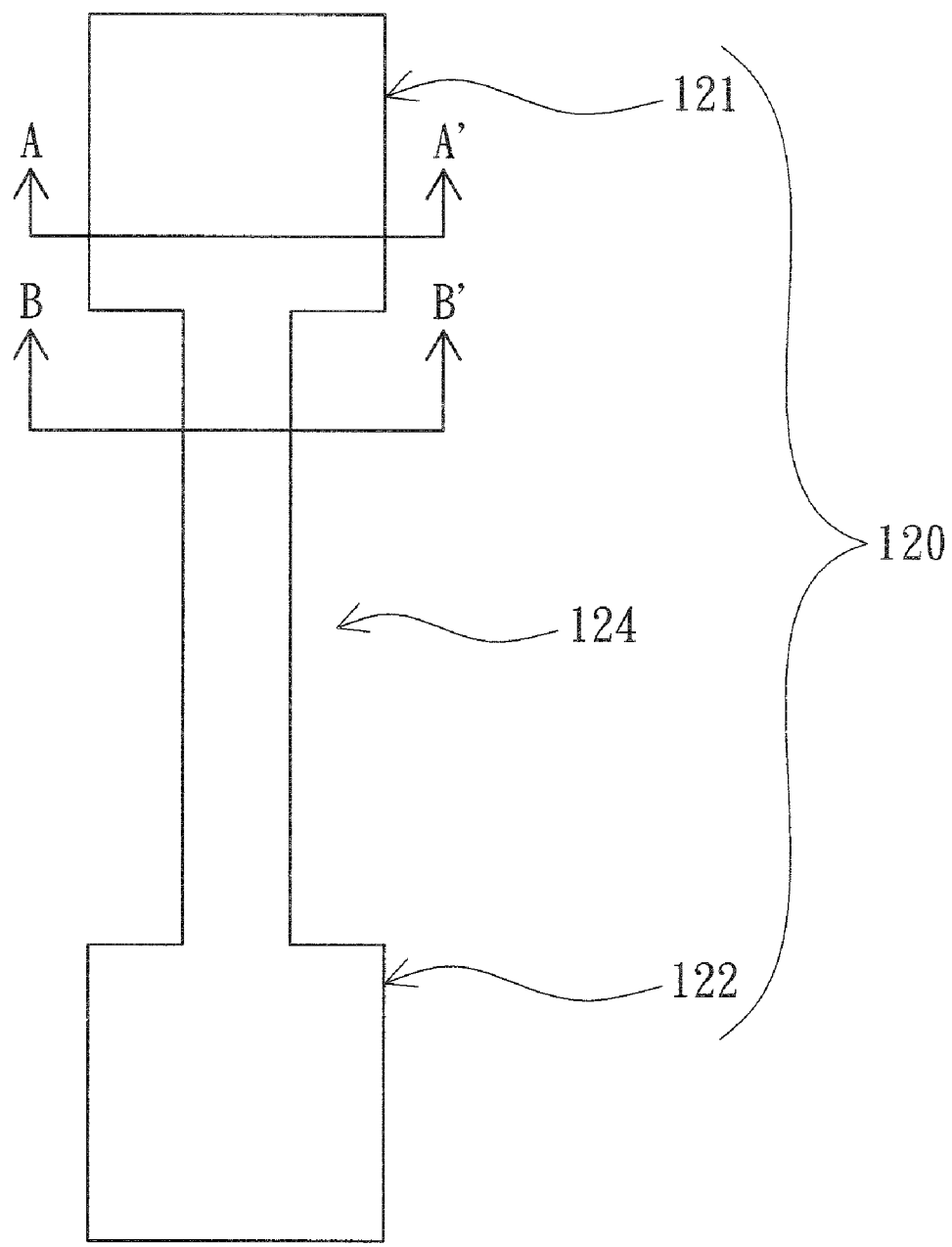
FIG. 6A is a schematic illustration showing a step of etching the semiconductor material layer and the supporting material layer.
Figure 6B:
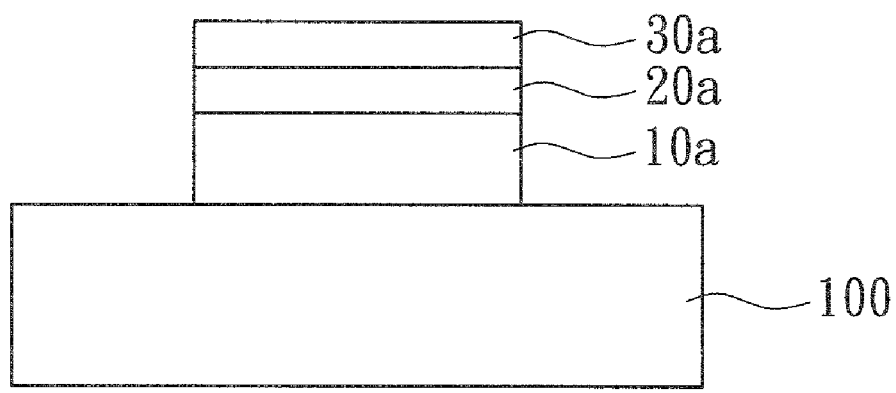
FIG. 6B is a cross-sectional view taken along a line AA' of FIG. 6A.
Figure 6C:
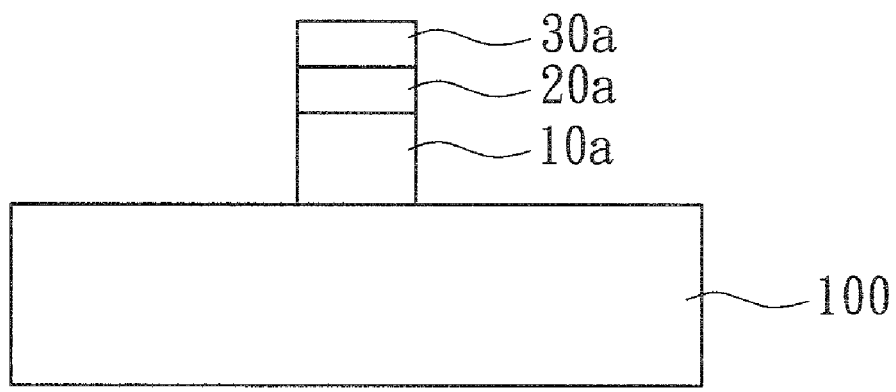
FIG. 6C is a cross-sectional view taken along a line BB' of FIG. 6A.

Then, as shown in step 203, the supporting material layer 10 and the semiconductor material layer 20 are patterned to form a supporting material layer 10a and a semiconductor material layer 20a. FIG. 6A is a schematic illustration showing a step of etching the semiconductor material layer and the supporting material layer. FIGS. 6B and 6C are cross-sectional views taken along lines AA' and BB' of FIG. 6A. The patterned semiconductor material layer 20a is formed with a channel structure 120, which has a channel bridge 124 and two platforms 121 and 122.

Figure 7A:
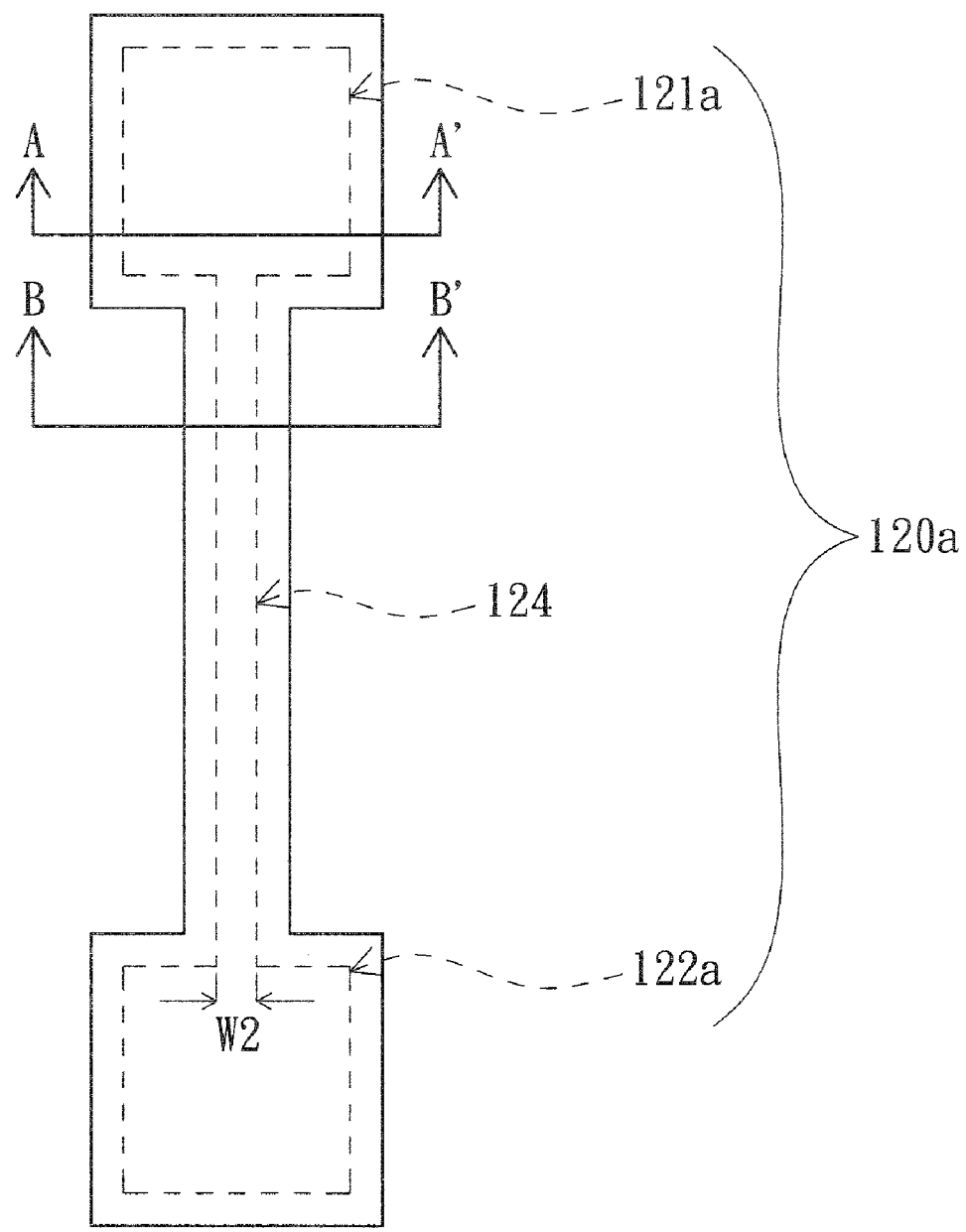
FIG. 7A is a schematic illustration showing a step of trimming a channel structure.
Figure 7B:
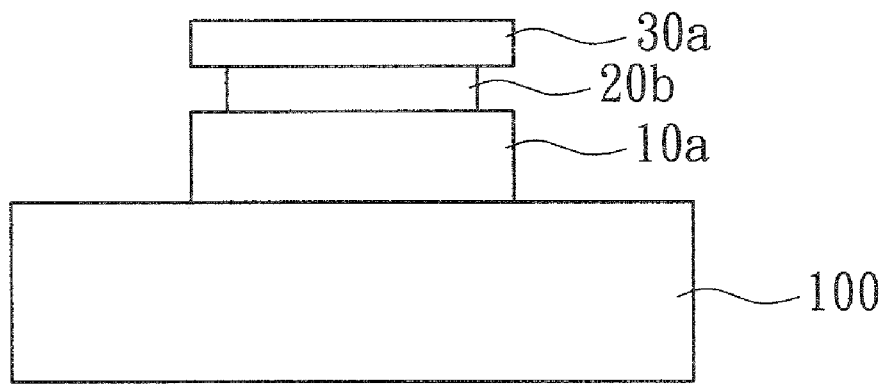
FIG. 7B is a cross-sectional view taken along a line AA' of FIG. 7A.
Figure 7C:
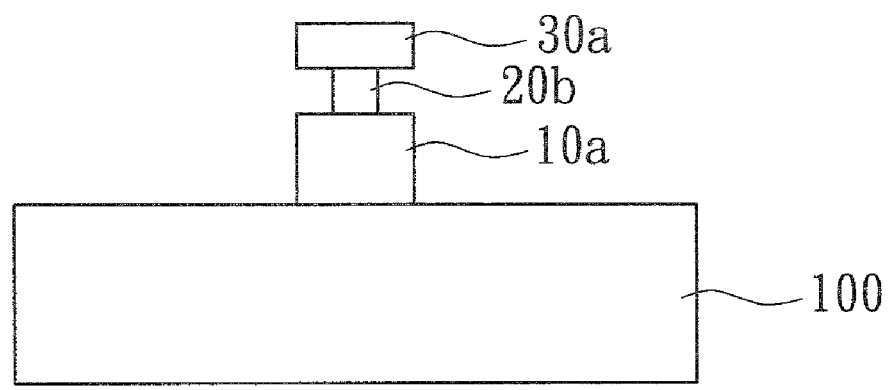
FIG. 7C is a cross-sectional view taken along a line BB' of FIG. 7A.

FIG. 7A is a schematic illustration showing a step of trimming a channel structure. FIGS. 7B and 7C are cross-sectional views taken along lines AA' and BB' of FIG. 7A. As shown in FIG. 7A, the channel structure 120 after being trimmed is formed with the channel structure 120a, the two platforms 121a and 122a and the channel bridge 124a, all of which have the reduced widths. This step may be performed by introducing fluorine gas or by partially oxidizing an exposed portion of the semiconductor material layer 20a according to an oxidizing process and then rinsing the oxidized exposed portion using buffered oxide etch (BOE) or hydrogen fluoride (HF) acid to form a semiconductor material layer 20b.

The width of the trimmed channel bridge 124a is decreased, so the gate wrapping around it has the better property of controlling the operation of switching the current of the channel.

Figure 8A:
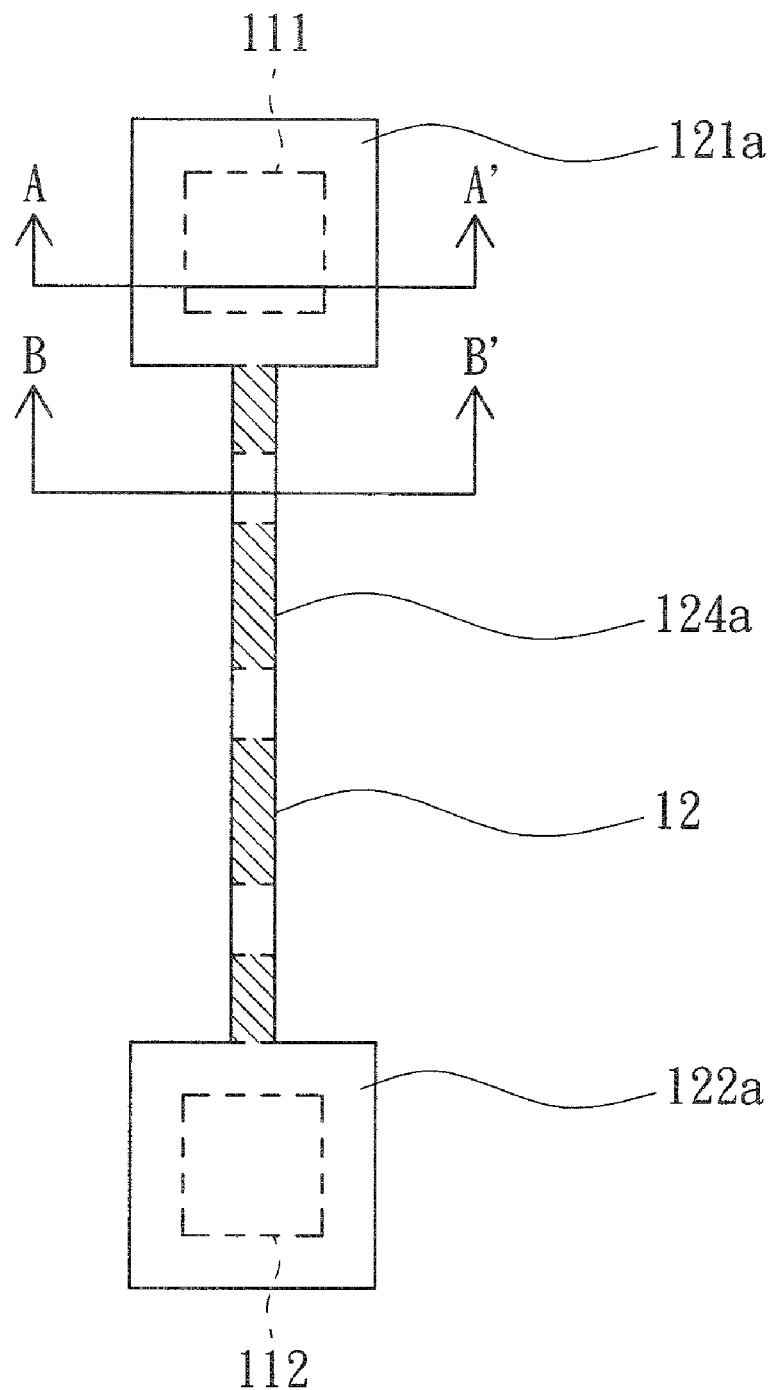
FIG. 8A is a schematic illustration showing a step of forming supporting pillars.
Figure 8B:
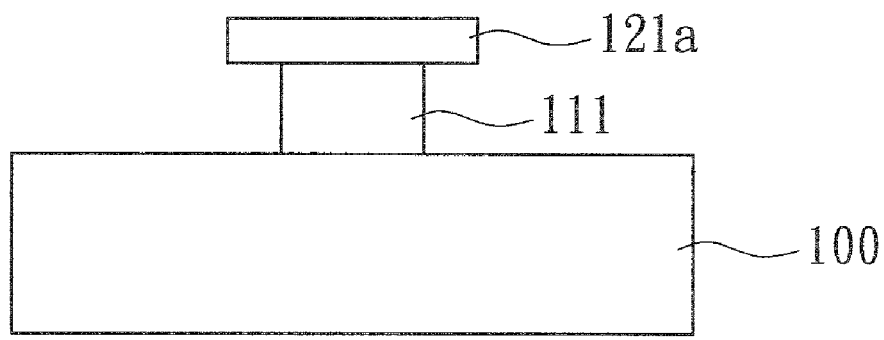
FIG. 8B is a cross-sectional view taken along a line AA' of FIG. 8A.
Figure 8C:
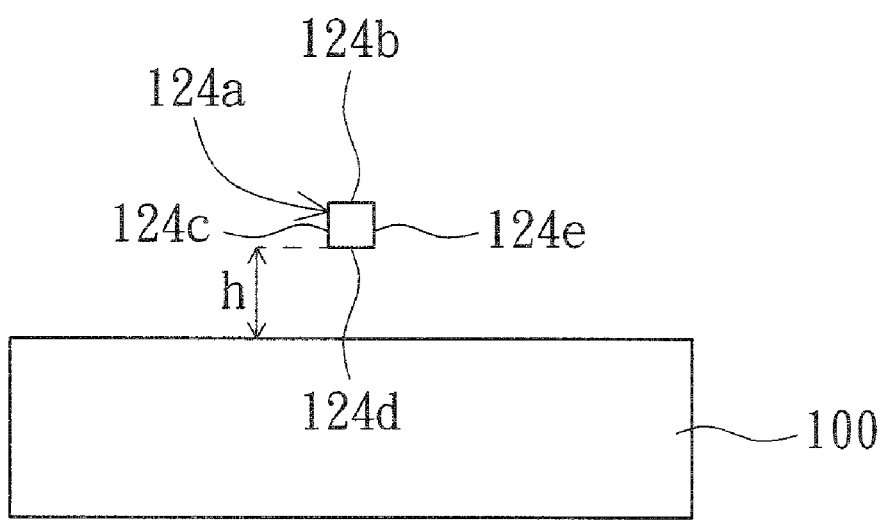
FIG. 8C is a cross-sectional view taken along a line BB' of FIG. 8A.

FIG. 8A is a schematic illustration showing a step of forming the supporting pillars. FIGS. 8B and 8C are cross-sectional views taken along lines AA' and BB' of FIG. 8A.

Then, as shown in FIGS. 2 and 8A to 8C, a portion of the supporting material layer below the channel bridge 124a is removed to form the two supporting pillars 111 and 112 in step 204. The two platforms 121a and 122a of the channel structure 120a are respectively formed on the supporting pillars 111 and 121. As shown in FIG. 8C, the channel bridge 124a has the first surface 124b, the second surface 124c, the third surface 124d and the fourth surface 124e, and the bottom third surface 124d is separated from the insulating layer 100 by the distance h.

Because the material of the semiconductor material layer 20b is polysilicon and the material of the supporting material layer 10a is silicon nitride in this embodiment, a portion of the supporting material layer 10a may be removed by way of wet etching using the etchant including the hot phosphoric acid to form the supporting pillars 111 and 112 without significantly influencing the pattern of the semiconductor material layer 20b in the step 204 as a result of good selectivity of hot phosphoric acid between polysilicon and silicon nitride. The supporting material layer below the channel bridge 124a has a narrower width, and thus can be completely removed after the wet etching immersion so that the channel bridge 124a with the suspended structure is formed. In addition, the material of the hard mask material layer 30a is also silicon nitride and the immersed contact surface area is larger, so the hard mask material layer 30a may be removed simultaneously in the step 204.

Alternatively, a portion of the supporting material layer 10a may be removed by way of reactive ion etching (RIE) to form the supporting pillars 111 and 112 in the step 204.

Furthermore, dopant of Group III or Group V can be doped into the channel bridge 124 or 124a to form a plurality of separated doping regions 12 prior to or after the step 204. The doping regions 12 are used as source regions or drain regions of memory of NAND structure. In this step, patterned photo resistant and hard mask can be used to protect the channel bridge 124 or 124a and expose the to-be-formed regions. Therefore the ion implanting or in-situ doping method can be used to implant or dope the dopant of Group III or Group V into the to-be-formed regions so as to form the doping regions 12.

In addition, the supporting material layer is made of silicon nitride and the semiconductor material layer is made of polysilicon in this illustrated embodiment, for example. In fact, however, a different semiconductor material may be used to form the semiconductor material layer and any other insulative material with the acceptable structure intensity may be used to form the supporting material layer as long as a portion of the supporting material layer may be removed without significantly etching the semiconductor material layer when the wet etching immersion is performed in the step 204 and as long as the supporting material layer and the semiconductor material layer have different etching selectivity to the etchant.

In addition, in the patterning process of the step 203, the step of forming the hard mask material layer may also be omitted so that the patterned photoresist layer 40 is directly formed on the semiconductor material layer 20. When the patterned resist layer 40 is kept, the etching process in the step 204 is performed. If other materials are adopted as the supporting material layer and the semiconductor material layer, the patterned photoresist layer 40 may also be kept to serve as the mask for wet etching, using the etchant including HF or BOE, to remove a portion of the supporting material layer. After the supporting pillars are formed, the patterned photoresist layer 40 can be removed.

Figure 9A:
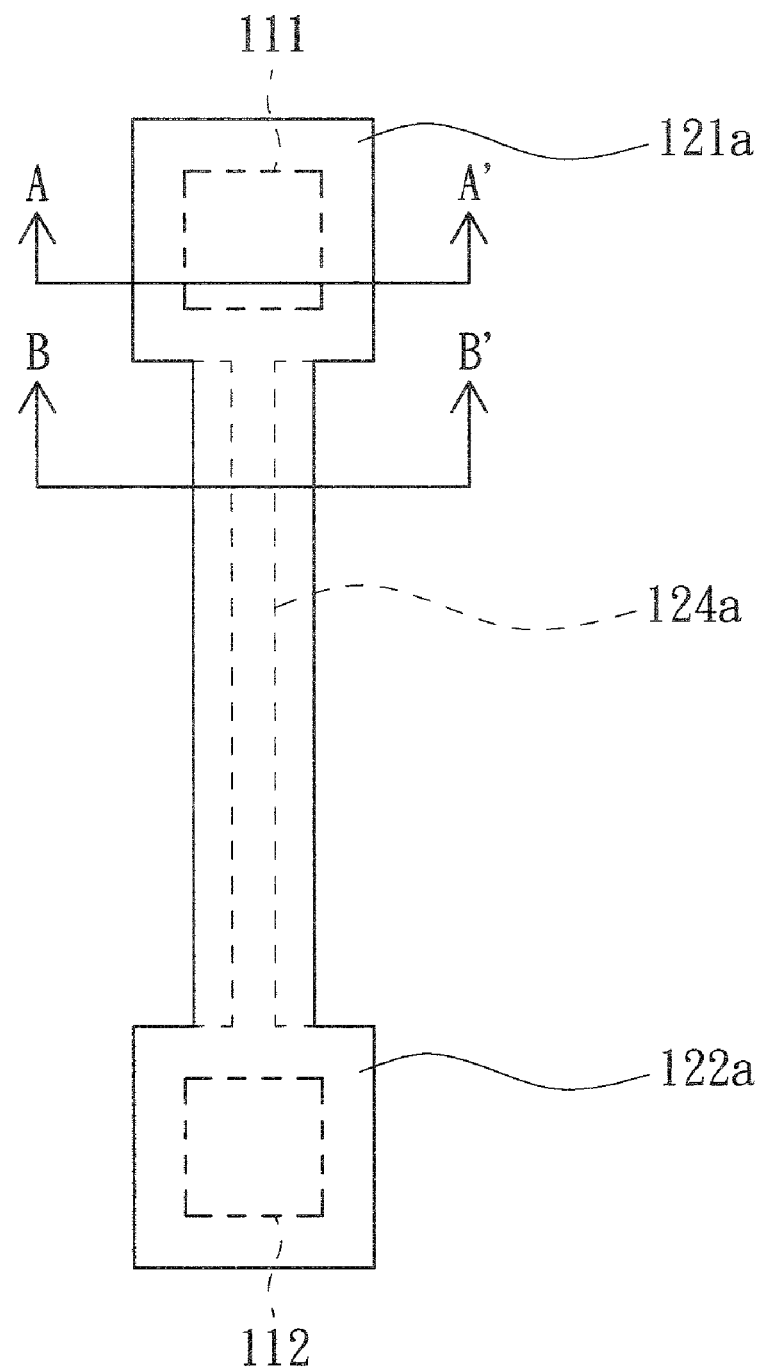
FIG. 9A is a schematic illustration showing a step of forming an insulating structure.
Figure 9B:
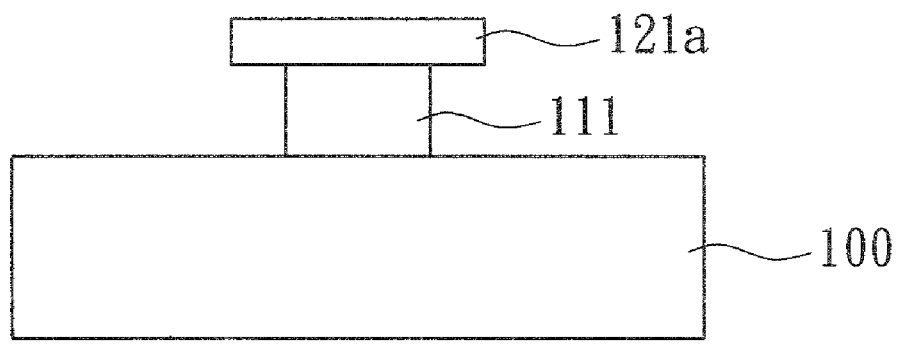
FIG. 9B is a cross-sectional view taken along a line AA' of FIG. 9A.
Figure 9C:
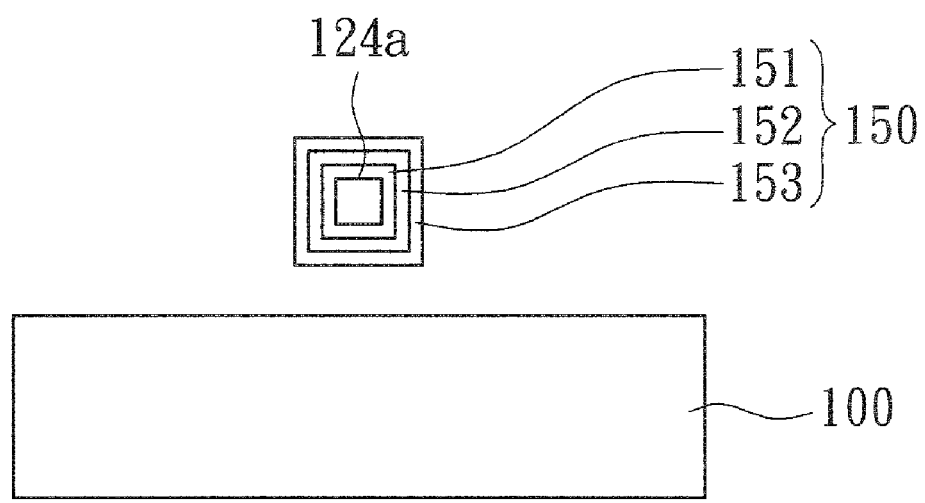
FIG. 9C is a cross-sectional view taken along a line BB' of FIG. 9A.

FIG. 9A is a schematic illustration showing a step of forming an insulating structure. FIGS. 9B and 9C are cross-sectional views taken along lines AA' and BB' of FIG. 9A. As shown in FIGS. 2 and 9A to 9C, the insulating structure 150 wrapping around the channel bridge 124a is formed in step 205. As shown in FIG. 9C, the insulating structure 150 wraps around the channel bridge 124a. In this embodiment, the step of forming the insulating structure 150 includes forming the blocking layer 151 wrapping around the channel bridge 124, then forming the charge storage layer 152 wrapping around the blocking layer 151, and then forming the tunneling dielectric layer 153 wrapping around the charge storage layer 152. The blocking layer 151 may be an oxide layer formed by oxidizing the surface of the channel bridge 124a, such as a silicon oxide layer, or may be an insulating dielectric layer, which wraps around the channel bridge 124a and is formed by way of chemical vapor deposition (CVD). The charge storage layer 152 may be an insulating dielectric layer, which wraps around the blocking layer 151 and is formed by way of CVD, such as a silicon nitride layer. The tunneling dielectric layer 153 may be an oxide layer formed by oxidizing the surface of the charge storage layer 152, or may be an insulating dielectric layer, which wraps around the charge storage layer 152 and is formed by way of CVD, such as a silicon oxide layer.

However, the technology of the invention is not limited thereto. The insulating structure 150 may include only one oxide layer, which is formed by oxidizing the surface of the channel bridge 124a, or one insulating layer, which is formed by way of CVD. In addition, the order of forming the blocking layer and the tunneling dielectric layer may also be reversed. That is, the tunneling dielectric layer is first formed, then the charge storage layer is formed, and then the blocking layer is formed. The tunneling dielectric layer may be the ONO layer or the OSO layer formed by way oxidation or CVD. According to the type of the insulating structure 150 in the step 204, it is possible to decide the formed semiconductor device as a transistor or any other memory with a different structure.

Figure 10A:
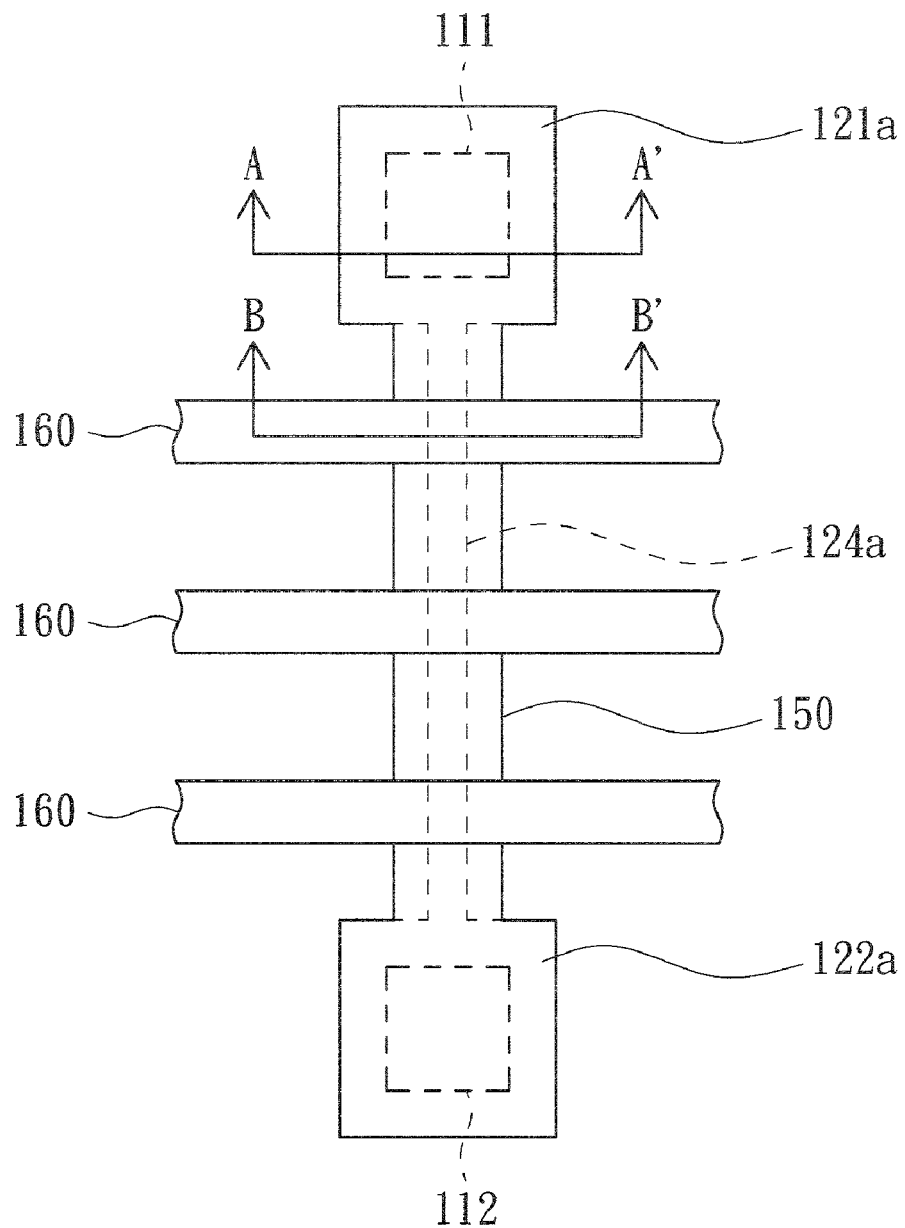
FIG. 10A is a schematic illustration showing a step of forming gates.
Figure 10B:
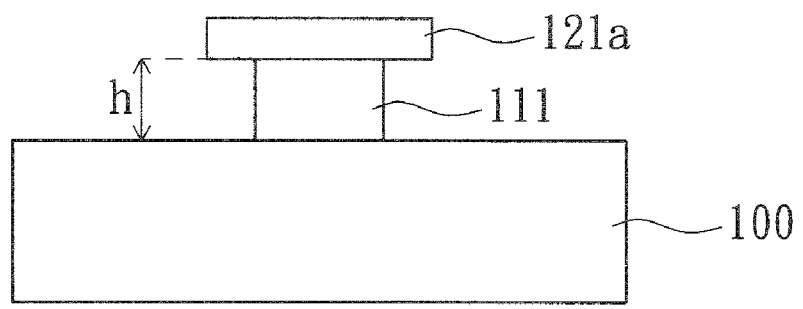
FIG. 10B is a cross-sectional view taken along a line AA' of FIG. 10A.
Figure 10C:
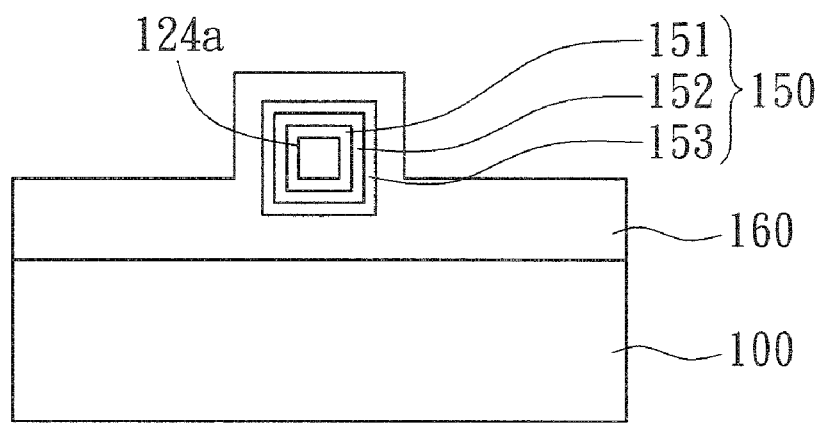
FIG. 10C is a cross-sectional view taken along a line BB' of FIG. 10A.

FIG. 10A is a schematic illustration showing a step of forming gates. FIGS. 10B and 10C are cross-sectional views taken along lines AA' and BB' of FIG. 10A. As shown in FIGS. 2 and 10A to 10C, the gates 160 wrapping around the insulating structure 150 are formed in step 206. In the step 206, The gate material can preferably use polysilicon to deposit and then be etched to form the separated gates 160 by using the carbon tetrafluoride ($CF_4$) or methyl chloride ($CH_3Cl$), or by way of RIE after the gate material is deposited, as shown in FIG. 10A.

Besides, it's preferable to dope the dopant of Group III or Group V into the gate 160, such that the gate 160 is converted into N+ polysilicon or P+ polysilicon. This step can be achieved by in-situ doping method.

Figure 11A:
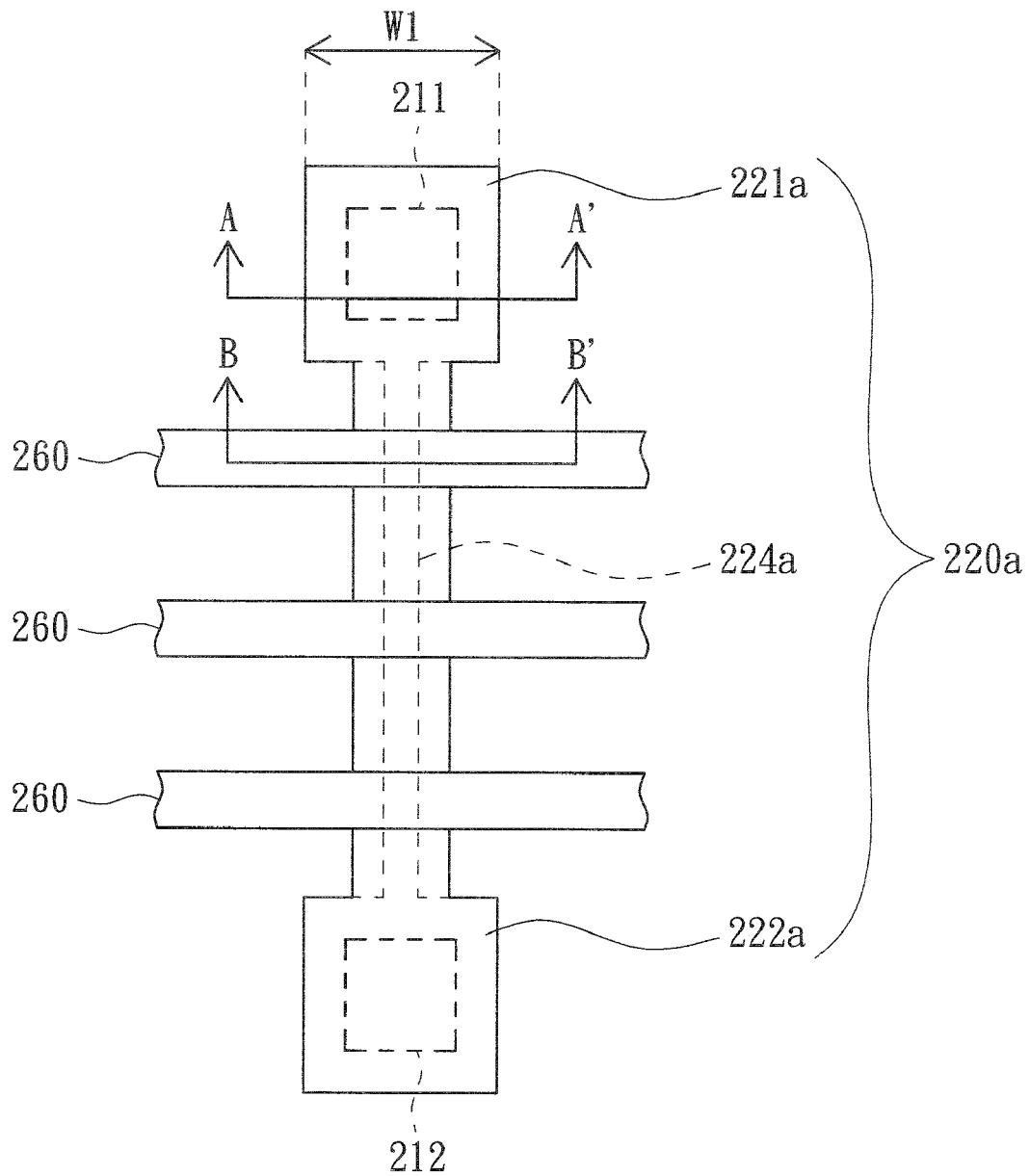
FIG. 11A is a top view showing a semiconductor device according to another preferred embodiment of the invention.
Figure 11B:
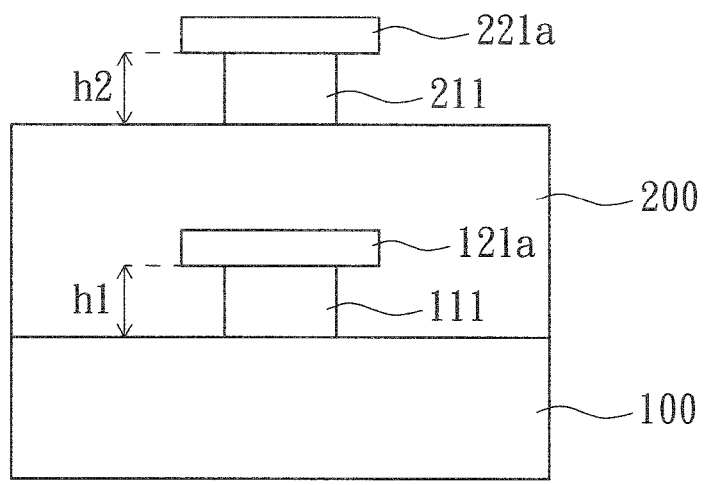
FIG. 11B is a cross-sectional view taken along a line AA' of FIG. 11A.
Figure 11C:
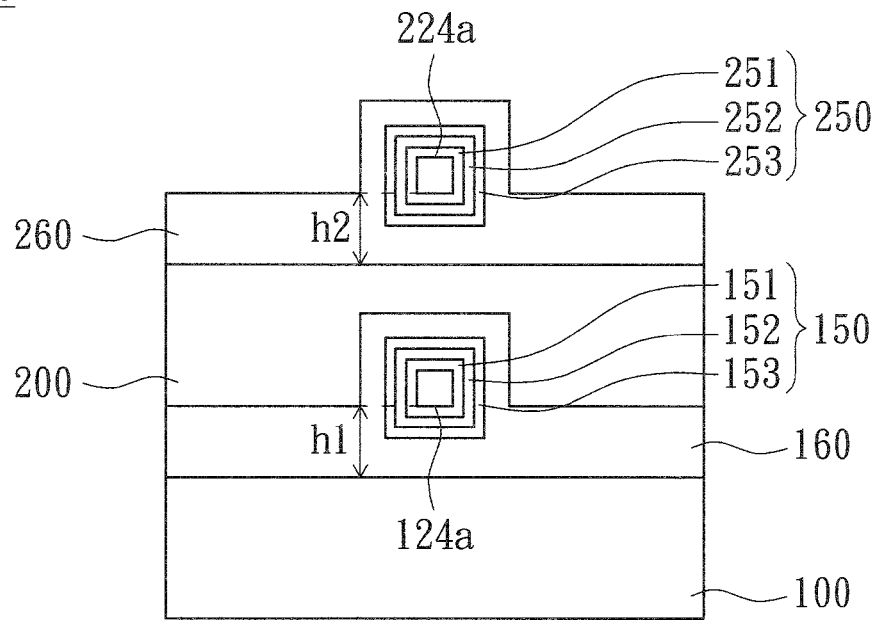
FIG. 11C is a cross-sectional view taken along a line BB' of FIG. 11A.

However, the technology of the invention is not limited thereto. FIG. 11A is a top view showing a semiconductor device according to another preferred embodiment of the invention. FIGS. 11B and 11C are cross-sectional views taken along lines AA' and BB' of FIG. 11A. As shown in FIGS. 11A and 11B, the semiconductor device 50 further includes an insulating layer 200 formed on the original semiconductor device 5 to cover the first insulating layer 100, the supporting pillars 121a and 122a, the channel structure 120a, the insulating structure 150 and the gates 160. Then, the same semiconductor device, which includes second supporting pillars 211 and 212, a second channel structure 220a, a second insulating structure 250 and second gates 260, is formed on the insulating layer 200 according to the same steps mentioned hereinabove. The second supporting pillars 211 and 212 protrude from the second insulating layer 200. The second channel structure 220a includes second platforms 221a and 222a and a second channel bridge 224a. The second platforms 221a and 222a are respectively disposed on the supporting pillars 211 and 212. The second channel bridge 224a connects the second platforms 221a and 222a together. A bottom of the second channel bridge 224a is separated from the second insulating layer 200 by a distance h2. The second insulating structure 250 wraps around the second channel bridge 224a. In this embodiment, the second insulating structure 250 similarly includes a blocking layer 251, a charge storage layer 252 and a tunneling dielectric layer 253. The second gates 260 wrap around the second insulating structure 250.

One of ordinary skill in the art may realize that the same stacked structure may be continuously formed on the semiconductor device 50 according to the manufacturing method mentioned hereinabove. Therefore, a high-density memory device may also be formed according to the semiconductor device and the method for manufacturing the same in accordance with the invention.

Figure 12A:
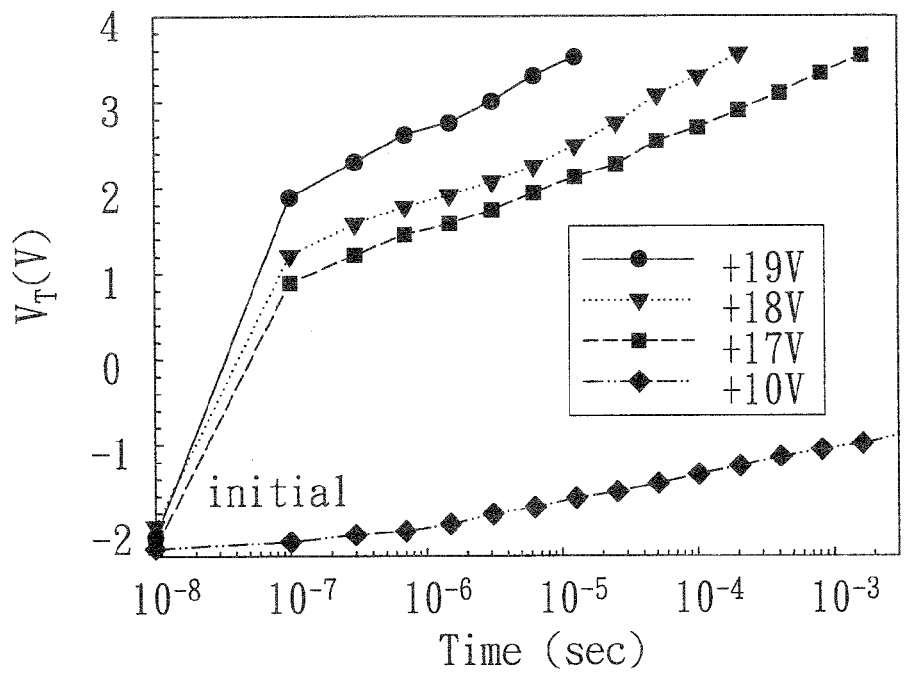
FIG. 12A is a histogram showing threshold levels of a BE-SONOS architecture memory which is programmed under different bias voltages according to the invention.
Figure 12B:
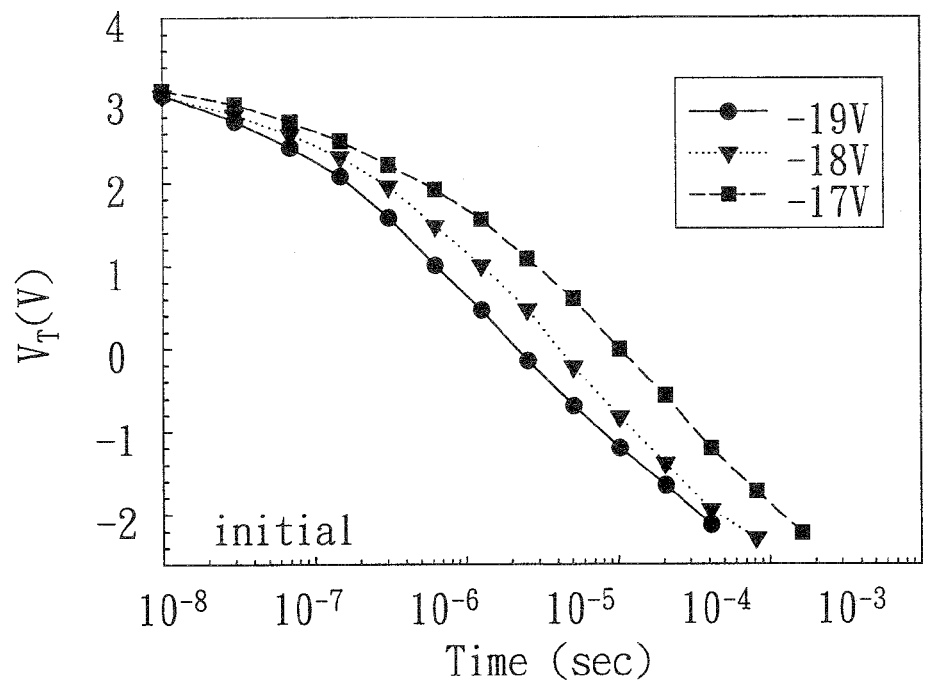
FIG. 12B is a histogram showing threshold levels of the BE-SONOS architecture memory which is erased under different bias voltages according to the invention.

FIG. 12A is a histogram showing threshold levels of a BE-SONOS architecture memory which is programmed under different bias voltages according to the invention; and FIG. 12B is a histogram showing threshold levels of the BE-SONOS architecture memory which is erased under different bias voltages according to the invention. When the insulating structure 150 of the semiconductor device 5 is the ONONO layer, the memory with the BE-SONOS architecture is formed. FIG. 12A shows threshold level variations of the memory device when the gates are biased with 17V, 18V and 19V and the Fowler-Nordheim (FN) injection is performed. As shown in FIG. 12A, the time duration when the threshold level significantly changes is shorter than 1 microsecond (µs), so the memory having the structure of the invention has the very-high programming speed. In addition, the tested influence of the read bias on the threshold level is also within the acceptable range when the gates are biased with 10 V.

As shown in FIG. 12B, the threshold level may be erased to a negative value when the -FN injection is performed. This property can cause the advantages of the power-saving operation and the convenient operation in the operation of a NAND memory array.

Figure 13:
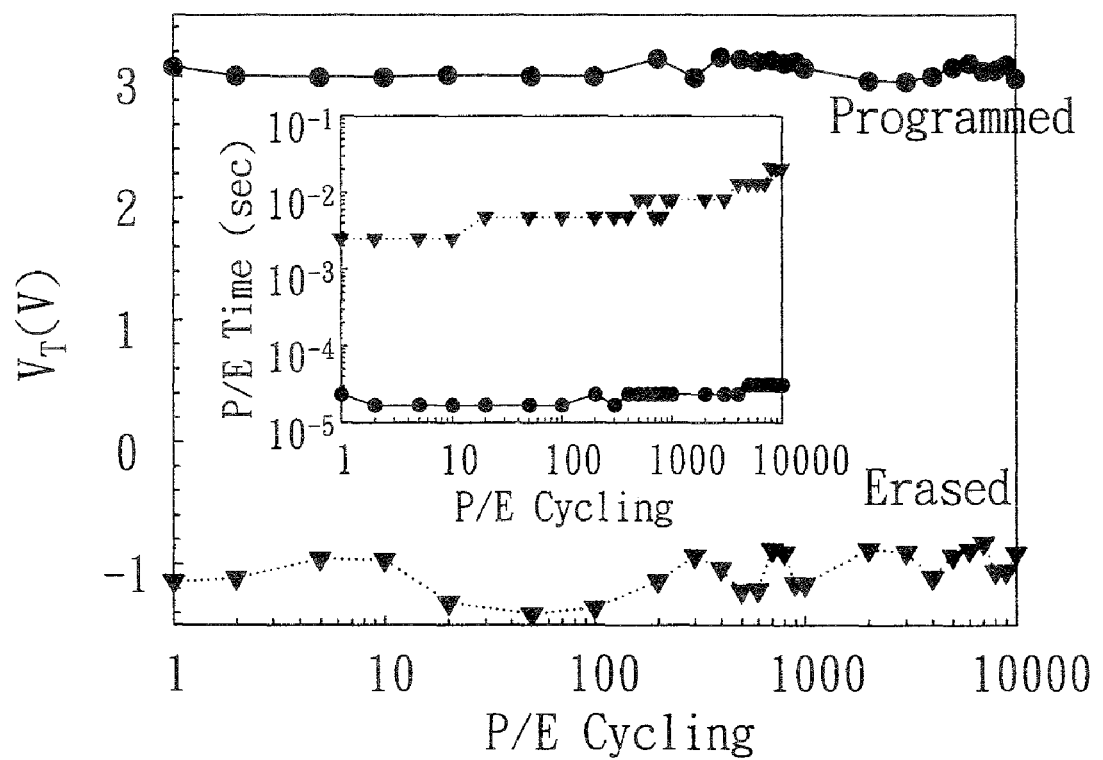
FIG. 13 shows a stability testing chart of the threshold levels of the BE-SONOS architecture memory according to the invention.

FIG. 13 shows a stability testing chart of the threshold levels of the BE-SONOS architecture memory according to the invention. As shown in FIG. 13, after 10,000 times of programming/erasing cycles, the memory with the BE-SONOS architecture of the invention still can hold the stable threshold level, and the programming time and the erasing time are not significantly changed. So, it is obtained that this memory has the very reliable operating stability.

The semiconductor device and the method for manufacturing the same according to the embodiments of the invention have the following features. The supporting material layer and the semiconductor material layer are sequentially formed on the insulating layer, and then a portion of the supporting material layer is removed to form the suspended channel structure. The channel structure has a single channel bridge structure between two platforms, that is, the source and the drain regions. Then, the insulating structure and the gate sequentially wrapping around the channel bridge are formed. Thus, the semiconductor material layer of this embodiment may utilize the two platforms to serve as the source/drain region, and utilize the suspended channel bridge to serve as the channel region. The two platforms are connected with the single channel bridge, so the manufacturing processes are simplified. In addition, the single channel bridge has the uniform material property. So, it is possible to prevent the variation of the current from being hardly controlled in operation due to the uniform material property of the channel, and the semiconductor device may have the reliable operating property.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device of a NAND memory structure, comprising:
    an insulating layer;
    a channel structure disposed above the insulating layer, the channel structure comprising:
        a channel bridge, connecting between two platforms, wherein a bottom of the channel bridge is separated from the insulating layer by a distance, and the channel bridge has a plurality of separated doping regions, wherein the two platforms and the plurality of separated doping regions are used as source/drain regions of the NAND memory structure;
    an insulating structure wrapping around the channel bridge; and
    a plurality of gates located adjacent to the doping regions and wrapping around the insulating structure.

2. The semiconductor device according to claim 1, wherein a width of the channel bridge is smaller than a width of each of the two platforms.

3. The semiconductor device according to claim 1, further comprising two supporting pillars disposed on the insulating layer, wherein a material of the two supporting pillars is silicon nitride.

4. The semiconductor device according to claim 1, wherein the channel bridge has a first surface, a second surface, a third surface and a fourth surface, and the insulating structure wraps around the first to fourth surfaces.

5. The semiconductor device according to claim 4, wherein the plurality of gates are disposed above the first to fourth surfaces.

6. The semiconductor device according to claim 1, wherein the insulating structure is an oxide layer.

7. The semiconductor device according to claim 1, wherein the insulating structure comprises:
    a blocking layer; and
    a charge storage layer disposed adjacent to the blocking layer.

8. The semiconductor device according to claim 7, wherein the insulating structure further comprises a tunneling dielectric layer disposed adjacent to the charge storage layer.

9. The semiconductor device according to claim 8, wherein the tunneling dielectric layer further comprises an ONO layer or an OSO layer.

10. The semiconductor device according to claim 3, further comprising:
    a second insulating layer covering the insulating layer, the two supporting pillars, the channel structure, the insulating structure and the plurality of gates;
    two second supporting pillars protruding from the second insulating layer;
    a second channel structure, which comprises:
        two second platforms respectively disposed on the two second supporting pillars; and
        a second channel bridge connecting the two second platforms, wherein a bottom of the second channel bridge is separated from the second insulating layer by a second distance;
    a second insulating structure wrapping around the second channel bridge; and
    a second gate wrapping around the second insulating structure.

* * * * *